(12) United States Patent
Ping et al.

(10) Patent No.: US 9,685,536 B2
(45) Date of Patent: Jun. 20, 2017

(54) VERTICAL TRANSISTOR HAVING A VERTICAL GATE STRUCTURE HAVING A TOP OR UPPER SURFACE DEFINING A FACET FORMED BETWEEN A VERTICAL SOURCE AND A VERTICAL DRAIN

(75) Inventors: Er-Xuan Ping, Meridian, ID (US); Jeffrey A. McKee, Meridian, ID (US)

(73) Assignee: Conversant Intellectual Property Management Inc., Ottawa (CA)

( * ) Notice: Subject to any disclaimer, the term of this patent is extended or adjusted under 35 U.S.C. 154(b) by 823 days.

(21) Appl. No.: 13/407,855

(22) Filed: Feb. 29, 2012

(65) Prior Publication Data
US 2012/0211824 A1    Aug. 23, 2012

Related U.S. Application Data

(62) Division of application No. 10/379,494, filed on Mar. 4, 2003, now abandoned, which is a division of
(Continued)

(51) Int. Cl.
*H01L 29/78*    (2006.01)
*H01L 29/66*    (2006.01)
(Continued)

(52) U.S. Cl.
CPC .... *H01L 29/66666* (2013.01); *H01L 21/0262* (2013.01); *H01L 21/02381* (2013.01);
(Continued)

(58) Field of Classification Search
CPC ......... H01L 27/10841; H01L 27/11273; H01L 29/66666; H01L 29/66787; H01L 29/7827; H01L 29/78642
See application file for complete search history.

(56) References Cited

U.S. PATENT DOCUMENTS 4,442,178 A    4/1984   Kimura et al.
4,554,570 A   11/1985   Jastrzebski et al.
(Continued)

FOREIGN PATENT DOCUMENTS

JP        01286361 A    11/1989
JP      2001068671 A     3/2001

OTHER PUBLICATIONS

S. Wolf et al., "Silicon Processing for the VLSI Era", vol. 1—Process Technology, 1986, pp. 155-156.
(Continued)

*Primary Examiner* — Anh Mai
(74) *Attorney, Agent, or Firm* — Conversant IP Management Corp.

(57) ABSTRACT

Raised structures comprising overlying silicon layers formed by controlled selective epitaxial growth, and methods for forming such raised-structure on a semiconductor substrate are provided. The structures are formed by selectively growing an initial epitaxial layer of mono crystalline silicon on the surface of a semi conductive substrate, and forming a thin film of insulative material over the epitaxial layer. A second epitaxial layer is selectively, grown on the exposed surface of the initial epitaxially grown crystal layer, and a thin insulative film is deposited over the second epitaxial layer. Additional epitaxial layers are added as desired to provide a vertical structure of a desired height comprising multiple layers of single silicon crystals, each epitaxial layer have insulated sidewalls, with the uppermost epitaxial layer also with an insulated top surface.

11 Claims, 8 Drawing Sheets

Related U.S. Application Data application No. 10/046,497, filed on Oct. 26, 2001, now abandoned, which is a division of application No. 09/816,962, filed on Mar. 23, 2001, now Pat. No. 7,176,109.

(51) Int. Cl.

| | | |
|---|---|---|
| *H01L 29/786* | (2006.01) | |
| *H01L 21/02* | (2006.01) | |
| *H01L 21/285* | (2006.01) | |
| *H01L 27/108* | (2006.01) | |

(52) U.S. Cl.
CPC .. *H01L 21/02532* (2013.01); *H01L 21/02573* (2013.01); *H01L 21/02639* (2013.01); *H01L 21/28562* (2013.01); *H01L 27/10873* (2013.01); *H01L 29/66628* (2013.01); *H01L 29/66787* (2013.01); *H01L 29/66893* (2013.01); *H01L 29/7834* (2013.01); *H01L 29/78642* (2013.01); *H01L 27/10876* (2013.01)

(56) References Cited

U.S. PATENT DOCUMENTS

| | | | |
|---|---|---|---|
| 4,757,027 A | 7/1988 | Vora | |
| 4,948,745 A | 8/1990 | Pfiester et al. | |
| 4,963,506 A | 10/1990 | Liaw et al. | |
| 5,057,888 A | 10/1991 | Fazan et al. | |
| 5,079,180 A | 1/1992 | Rodder et al. | |
| 5,087,586 A | 2/1992 | Chan et al. | |
| 5,122,476 A | 6/1992 | Fazan et al. | |
| 5,156,987 A | 10/1992 | Sandhu et al. | |
| 5,168,089 A | 12/1992 | Feyenson et al. | |
| 5,198,378 A | 3/1993 | Rodder et al. | |
| 5,200,352 A | 4/1993 | Pfiester | |
| 5,208,172 A | 5/1993 | Fitch et al. | |
| 5,241,193 A | 8/1993 | Pfiester et al. | |
| 5,304,834 A | 4/1994 | Lynch | |
| 5,308,782 A | 5/1994 | Mazure et al. | |
| 5,312,768 A | 5/1994 | Gonzalez | |
| 5,316,962 A | 5/1994 | Matsuo et al. | |
| 5,360,760 A | 11/1994 | Hayashi | |
| 5,363,793 A * | 11/1994 | Sato .................................. 117/2 | |
| 5,376,562 A | 12/1994 | Fitch et al. | |
| 5,393,681 A | 2/1995 | Witek et al. | |
| 5,397,909 A | 3/1995 | Moslehi | |
| 5,460,994 A | 10/1995 | Kim | |
| 5,483,094 A | 1/1996 | Sharma et al. | |
| 5,497,017 A | 3/1996 | Gonzales | |
| 5,547,889 A | 8/1996 | Kim | |
| 5,574,299 A | 11/1996 | Kim | |
| 5,578,850 A | 11/1996 | Fitch et al. | |
| 5,595,920 A | 1/1997 | Miyawaki et al. | |
| 5,599,724 A | 2/1997 | Yoshida | |
| 5,600,161 A | 2/1997 | Gonzalez et al. | |
| 5,612,230 A | 3/1997 | Yuzurihara et al. | |
| 5,612,563 A | 3/1997 | Fitch et al. | |
| 5,627,395 A | 5/1997 | Witek et al. | |
| 5,641,694 A | 6/1997 | Kenney | |
| 5,677,573 A | 10/1997 | Prall et al. | |
| 5,691,212 A | 11/1997 | Tsai et al. | |
| 5,753,555 A | 5/1998 | Hada | |
| 5,753,947 A | 5/1998 | Gonzalez | |
| 5,780,327 A | 7/1998 | Chu et al. | |
| 5,780,906 A | 7/1998 | Wu et al. | |
| 5,831,334 A | 11/1998 | Prall et al. | |
| 5,841,150 A | 11/1998 | Gonzalez et al. | |
| 5,843,826 A | 12/1998 | Hong | |
| 5,849,077 A | 12/1998 | Kenney | |
| 5,863,826 A | 1/1999 | Wu et al. | |
| 5,864,180 A | 1/1999 | Hori et al. | |
| 5,872,374 A | 2/1999 | Tang et al. | |
| 5,886,382 A | 3/1999 | Witek | |
| 5,888,294 A | 3/1999 | Min et al. | |
| 5,902,125 A | 5/1999 | Wu | |
| 5,933,738 A | 8/1999 | Kao et al. | |
| 5,945,698 A | 8/1999 | Prall | |
| 5,949,105 A | 9/1999 | Moslehi | |
| 5,953,605 A | 9/1999 | Kodama | |
| 5,963,822 A | 10/1999 | Saihara et al. | |
| 5,970,351 A | 10/1999 | Takeuchi | |
| 5,994,735 A | 11/1999 | Maeda et al. | |
| 5,998,248 A | 12/1999 | Ma et al. | |
| 5,998,844 A | 12/1999 | Prall et al. | |
| 6,001,697 A | 12/1999 | Chang et al. | |
| 6,018,176 A | 1/2000 | Lim | |
| 6,037,202 A | 3/2000 | Witek | |
| 6,051,473 A | 4/2000 | Ishida et al. | |
| 6,057,200 A | 5/2000 | Prall et al. | |
| 6,072,226 A | 6/2000 | Thakur et al. | |
| 6,074,478 A | 6/2000 | Oguro | |
| 6,090,691 A | 7/2000 | Ang et al. | |
| 6,096,596 A | 8/2000 | Gonzalez | |
| 6,127,232 A | 10/2000 | Chatterjee et al. | |
| 6,143,608 A | 11/2000 | He et al. | |
| 6,159,852 A | 12/2000 | Nuttall et al. | |
| 6,228,733 B1 | 5/2001 | Lee et al. | |
| 6,232,641 B1 | 5/2001 | Miyano et al. | |
| 6,248,637 B1 | 6/2001 | Yu | |
| 6,268,621 B1 | 7/2001 | Emmi et al. | |
| 6,300,251 B1 | 10/2001 | Pradeep et al. | |
| 6,319,782 B1 | 11/2001 | Nakabayashi | |
| 6,391,692 B1 | 5/2002 | Nakamura | |
| 6,392,271 B1 | 5/2002 | Alavi et al. | |
| 6,426,259 B1 | 7/2002 | Yu | |
| 6,433,382 B1 | 8/2002 | Orlowski et al. | |
| 6,448,129 B1 | 9/2002 | Cho et al. | |
| 6,455,377 B1 | 9/2002 | Zheng et al. | |
| 6,458,699 B1 | 10/2002 | Nuttall et al. | |
| 6,479,875 B1 | 11/2002 | Gonzalez | |
| 6,492,232 B1 | 12/2002 | Tang et al. | |
| 6,495,437 B1 | 12/2002 | Yu | |
| 6,506,649 B2 | 1/2003 | Fung et al. | |
| 6,509,239 B1 | 1/2003 | Nuttall et al. | |
| 6,594,293 B1 | 7/2003 | Bulsara et al. | |
| 6,620,710 B1 | 9/2003 | Kamins | |
| 6,660,650 B1 | 12/2003 | Konecni et al. | |
| 7,097,708 B2 * | 8/2006 | Clark et al. ..................... 117/94 | |
| 2001/0040292 A1 | 11/2001 | Hahn et al. | |
| 2002/0072181 A1 | 6/2002 | Tseng | |
| 2002/0093054 A1 | 7/2002 | Yeh et al. | |
| 2004/0175893 A1 | 9/2004 | Vatus et al. | |

OTHER PUBLICATIONS

Ginsberg et al., "Selective epitaxial growth of silicon and some potential application", IBM J. Res Develop. 34(6): Nov. 1990.

P. Van Zant, "Microchip Fabrication, a Practical Guide to Semiconductor Processing", 4th Edition, McGraw-Hill, New York, NY (2000), Chapter 12 at pp. 380-388.

Wolf et al., "Silicon Processing for the VLSI Era", vol. 1: Process Technology, 2nd Ed., Lattice Press, Sunset Beach, CA (2000), Chapter 7 (Silicon Epitaxial Growth and Silicon on Insulator) at pp. 225-264.

Blanton et al., "X-Ray Diffraction Characterization of Multilayer Epitaxial Thin Films Deposited on (0001) Sapphire", The Rigaku Journal, vol. 13 (1996).

* cited by examiner

VERTICAL TRANSISTOR HAVING A VERTICAL GATE STRUCTURE HAVING A TOP OR UPPER SURFACE DEFINING A FACET FORMED BETWEEN A VERTICAL SOURCE AND A VERTICAL DRAIN

CROSS REFERENCE TO RELATED APPLICATIONS

This application is a divisional of U.S. application Ser. No. 10/379,494 filed Mar. 4, 2003, which is a divisional of U.S. application Ser. No. 10/046,497 filed Oct. 26, 2001, now abandoned, which is a divisional of U.S. patent application Ser. No. 09/816,962 filed Mar. 23, 2001, now U.S. Pat. No. 7,176,109 which issued Feb. 13, 2007, the contents of which are incorporated by reference in their entirety.

FIELD OF THE INVENTION

The present invention relates to the field of semiconductor fabrication, and more particularly to vertical transistors and other raised structures of a semiconductor device that are formed by controlled selective epitaxial growth.

BACKGROUND OF THE INVENTION

The storage capacity of a memory chip is dependent on the number of memory cells in the chip. High density dynamic random access memory (DRAMs) cells are comprised of two main components, a field-effect transistor (FET) and a storage capacitor. In DRAM fabrication, there is a continuing need to provide higher density memories in order to further increase data storage capacity.

Increasing circuit density in DRAM fabrication requires a reduction in the size of the FETs and storage capacitors of memory cells. As a solution to this problem, trench capacitors, vertically stacked capacitors, elevated source and drain structures, and other improved structures have been developed which require less surface area. However, photolithographic processing limits the minimal size of the feature and the resulting device that can be formed. Thus, the density of storage cells of a memory array has been limited by the resolution capability of the available photolithographic equipment.

Therefore, there is a need for a semiconductor fabrication technique to provide high density memory structures that can be fabricated without the limitations of photolithographic processing steps.

SUMMARY OF THE INVENTION

The present invention relates to elevated structures such as transistors and raised source/drain regions formed on a semiconductor substrate by controlled growth of epitaxial layers and methods for forming such structures.

The invention utilizes selective epitaxial growth (SEG) to form vertically oriented structures on semiconductor substrates. Crystal growth by SEG along a select facet to form a vertically oriented structure cannot be controlled by varying the growth conditions due to the existence of facets on the crystal having different orientations i.e., (100), (110), (111). However, such control is needed to achieve vertically oriented epitaxial growth and eliminate lateral or horizontal growth that can short circuit closely positioned adjacent devices. The present method employs insulative spacers formed over the sidewalls of the epitaxial layers to eliminate unwanted lateral growth and control the growth of the epitaxial film.

In one aspect, the present invention provides a method for forming a vertical structure on a semiconductor substrate by selective epitaxial growth. An exemplary semiconductive substrate comprises monocrystalline silicon having a (100) orientation.

In one embodiment of the method of the invention, a vertical structure can be formed on a semiconductive substrate. The method involves selectively growing a first epitaxial layer of monocrystalline silicon on the surface of the substrate. Prior to the SEG step, it is desirable to remove oxide from the area on the substrate where the structure is to be formed, for example, by a dry oxide etch. The semiconductive substrate is exposed to a silicon-comprising gas in an epitaxial (epi) growth chamber for a time and under conditions effective to form an epitaxial layer of monocrystalline silicon having a faceted surface. The epitaxial layer comprises a single silicon crystal having vertically oriented sidewalls and a top horizontal surface, preferably defining a facet having a (100) plane orientation.

Upon forming the initial epitaxial layer on the surface of the substrate, a thin film of insulative material is formed over the epitaxial layer. Preferably, the insulation layer is formed by rapid thermal annealing, i.e., rapid thermal oxidation (RTO) to form an oxide film, or by rapid thermal nitridation (RTN) to form a nitride film. A portion of the insulative layer is then removed, preferably by reactive ion etching (RIE), to expose only the top (horizontal) surface of the epitaxial layer, with the insulative material remaining along the sidewalls as a spacer. A second epitaxial layer of monocrystalline silicon is grown by SEG on the exposed horizontal surface of the initial epitaxial layer. A thin insulative film is then formed over the second epitaxial layer. Further epitaxial layers can be similarly added to increase the height of the structure as desired, by repeating the foregoing steps.

The resultant vertically-oriented structure comprises multiple epitaxial layers having insulated sidewalls, with the uppermost layer having an insulated top surface. The structure can function, for example, as a vertical gate or word line of a DRAM cell, in which case it is preferred that the semiconductive substrate underlying the structure is lightly doped with a conductivity enhancing material. Source/drain regions can be formed adjacent to the structure by conventional methods, or as an elevated structure by the method of the invention, as described below.

In another embodiment of the method of the invention, a vertical structure of a desired height can be formed adjacent to an existing transistor gate or word line on a substrate. The gate or word line-can be formed by the method of the invention, or by conventional methods known in the art. In forming vertical source/drain structures, the structures comprise a sufficient amount of a conductivity enhancing dopant to effectively provide the source and drain regions. The doping step can be performed during one or more SEG steps by flowing a silicon-comprising gas combined with a conductivity enhancing dopant onto the substrate, or after the structures have been formed by ion implantation.

According to another embodiment of the method of the invention, a plurality of elevated transistors can be formed on a substrate so as to define an array of transistors. The transistors can be isolated by areas of insulative material, such as shallow trench isolation regions comprising an oxide.

In yet another embodiment of the method, an elevated transistor can be formed on a semiconductive substrate, the transistor comprising a buried drain, a vertical gate region, and an overlying source region. The buried drain can be formed in a semiconductive substrate by conventional ion implantation processing. An elevated gate region can be formed by selectively growing an initial epitaxial layer of monocrystalline silicon on the substrate overlying the drain, depositing an insulative layer over the epitaxial layer, and selectively removing the horizontal surface of the insulative layer to expose only the top surface of the epitaxial layer. Additional epitaxial layers can be added by repeating the SEG step, and depositing the insulative layer, and selectively removing the insulative layer to maintain insulative material along the sidewalls as spacers to limit the growth of the epitaxial layer in a vertical orientation, resulting in a pillar-like gate region having a desired height. A source region can then be formed by SEG above the uppermost epitaxial layer of the gate region. To do so, a conductivity enhancing dopant can be added while the epitaxial layer is being deposited, or after the formed epitaxial layer is formed, for example, by ion implantation.

In another aspect, the invention provides raised structures comprising multiple layers of monocrystalline silicon formed by controlled selective epitaxial growth. An exemplary structure is a transistor comprising source/drain diffusion regions adjacent to a transistor gate, one or more of the foregoing components of the transistor comprising multiple epitaxial layers having insulated sidewalls and a top surface.

In one embodiment of a transistor, the transistor gate comprises at least two overlying layers of epitaxially grown silicon, each epitaxial layer comprising a single silicon crystal having a top or upper surface defining a facet, preferably having a (100) plane orientation, and vertically-oriented and insulated sidewalls. The uppermost epitaxial layer of the gate also has an insulated top surface, such that the gate is covered by a layer of insulative material. The gate is a vertical structure that is oriented in a vertical plane from the substrate surface. The source/drain comprises diffusion regions adjacent to the transistor gate within the semiconductive region, and can be formed according to known methods in the art.

In another embodiment of a transistor according to the invention, the source/drain regions are elevated structures that extend in a vertical plane from the substrate. The transistor gate comprises an existing vertical structure between the source/drain regions, which can be formed according to known methods in the art or in accordance with the invention. The source/drain structures comprise at least two overlying layers of epitaxially grown silicon, each epitaxial layer comprising a single silicon crystal having a top surface and vertically oriented insulated sidewalls. Preferably, the top surface of the epitaxial layers defines a facet having a (100) plane orientation. The top surface of the uppermost epitaxial layer is also insulated. The source/drain regions also comprise a conductivity enhancing dopant that is added as the epitaxial layers are deposited, or afterwards to the formed structure by ion implantation prior to depositing the insulative layer onto the uppermost epitaxial layer of the structure.

In yet another embodiment of a transistor according to the invention, both the transistor gate and the adjacent source/drain regions are vertical structures comprising multiple epitaxial layers having insulated sidewalls and an insulated top surface on the uppermost epitaxial layer.

A further embodiment of a transistor according to the invention comprises a drain buried within a semiconductive substrate, a vertical gate region overlying the buried drain, and a source region overlying the gate region. The vertical gate region comprises at least two overlying layers of epitaxially grown silicon having sidewalls covered by an insulative material, with the uppermost epitaxial layer having a layer of insulative material over its top surface. The drain can comprise a doped area within the substrate underlying the gate region. The source region comprises at least one layer of epitaxially grown silicon overlying the uppermost layer of the gate region. The epitaxial layer of the source region has insulated sidewalls and on top surface, and is doped with a conductivity enhancing dopant.

The invention provides useful and improved vertically oriented structures such as transistors gates and elevated source/drain regions that extend outwardly from a substrate. Such structures are particularly suited for use in a DRAM cell or other semiconductor structure. The vertical nature of the structures allows a larger number of transistors or other semiconductor structures per surface area compared to conventional devices.

BRIEF DESCRIPTION OF THE DRAWINGS

Preferred embodiments of the invention are described below with reference to the following accompanying drawings, which are for illustrative purposes only. Throughout the following views, reference numerals will be used on the drawings, and the same reference numerals will be used throughout the several views and in the descriptions to indicate same or like parts.

DETAILED DESCRIPTION OF THE PREFERRED EMBODIMENTS

The present invention encompasses methods of controlling growth of an epitaxial film in semiconductive wafer processing to form raised or vertical structures on a semiconductor surface, and structures formed from such methods, for example, transistors, capacitors, and elevated source/drain regions, among others.

In the current application, the term "semiconductive wafer fragment" or "wafer fragment" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments described above.

A first embodiment of a method of the present invention is described with reference to FIGS. 1A through 1I, in a method of forming raised source/drain structures by controlled selective epitaxial growth adjacent to an existing structure such as a gate or word line. To form elevated source/drain regions, the epitaxial layers are selectively grown from exposed monocrystalline source and drain substrate areas, and provided with sufficiently high conductivity doping to effectively provide source and drain regions.

Figure 1A:
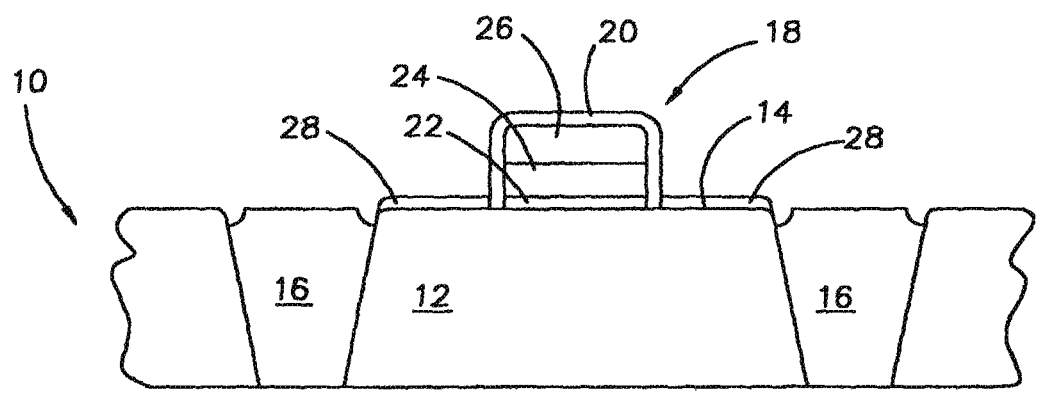
FIG. 1A is a diagrammatic cross-sectional view of a semiconductive wafer fragment at a preliminary step of a processing sequence.

Referring to FIG. 1A, a semiconductive wafer fragment 10 is shown at a preliminary processing step. Semiconductive wafer fragment 10 comprises a substrate 12 having a surface 14, and dielectric isolation regions 16 such as a shallow trench isolation (STI) region comprising an oxide. The substrate 12 typically comprises monocrystalline silicon having a (100) orientation, and typically includes a light conductivity dopant concentration.

Formed on the surface 14 of the substrate 12 is a structure 18 with an overlying insulative layer 20. An exemplary structure 18 is a word line or transistor gate. The word line or gate 18 can be formed by conventional methods known and used in the art. For example, a polysilicon layer 24 can be deposited by chemical vapor deposition (CVD) or other suitable method over a thin pad oxide layer 22 (about 200 to about 500 angstroms) grown on the substrate 12, and a silicide layer 26 can then be deposited by CVD or other method to form a polysilicon/silicide composite that is etched using a masking step, and covered with a thermally grown oxide insulative layer 20, resulting in the word line or gate structure 18. As shown, the word line or gate structure 18 is electrically isolated by means of the adjacent STI regions 16. The STI regions can also be formed by conventional methods by etching a trench to a depth of about 1 micron or less into the substrate 12, and filling the trench with an insulative material such as silicon dioxide ($SiO_2$). An oxide layer 28 covers the substrate surface 14 adjacent the word line or gate structure 18.

Referring to FIGS. 1B through 1H, in one embodiment of the method of the invention, raised source/drain structures can be fabricated on a surface 14 of a semiconductive substrate adjacent to an existing word line or gate 18 by selective epitaxial growth (SEG). Using the present method, the source/drain regions 30, 32 can be fabricated to a height that is greater than conventional structures without lateral growth that poses problems with short circuiting adjacent structures. According to the method, thin epitaxial layers comprising a single crystal with a facet having a plane orientation of (100), (110) or (111) on its upper or top surface, preferably a plane orientation of (100), are selectively grown on the surface of a moncrystalline silicon substrate and on subsequent crystal layers within an epitaxial (epi) growth reactor. Preferably, the epitaxial layers have a thickness of up to about 200 nm, preferably about 50 to about 200 nm, preferably about 70 to about 100 nm.

Preferably, the surface 14 of the substrate 12 is cleaned prior to the SEG step to remove oxides and other impurities. For example, the substrate 12 can undergo an oxide dry etch to remove an overlying oxide layer 28 and expose the surface 14 of the substrate. For example, the substrate can be etched by exposure to an H2 gas at about 800° C. to about 850° C., or exposure to a reactive plasma such as NF3 at about 100° C., in a chemical vapor deposition reactor. Another example of a cleaning method is to soak the substrate 12 with 0.5 vol. % diluted hydrofluoric acid (HF) to remove a native oxide film formed on the substrate surface, wash the substrate in deionized water for about two minutes, and dry the substrate using a spin drier. Other cleaning techniques can also be used to effectively clean the surface of the substrate.

Figure 1B:
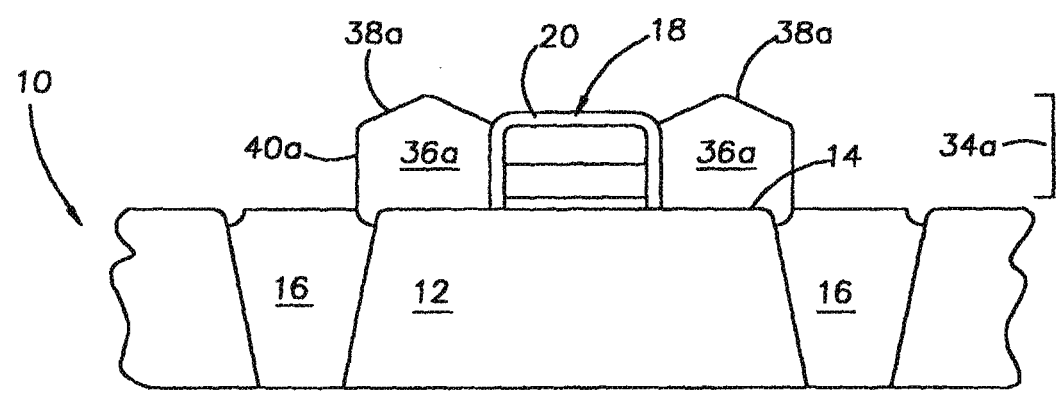
FIGS. 1B through 1H are views of the semiconductive wafer fragment of FIG. 1A at subsequent and sequential processing steps according to an embodiment of the method of the invention, showing fabrication of two elevated structures adjacent to a gate or word line.

In a first step shown in FIG. 1B, with at least a portion of the oxide layer 28 having been removed to expose surface 14 of the monocrystalline silicon substrate 12, a first layer 34a of monocrystalline silicon is formed on the exposed surface by selective epitaxial growth. The first layer 34a comprises a single crystal 36a that is preferably grown until a facet is formed on the top surface 38a. The facet surface can be a (100), (110) or (111) plane orientation, with a (100) plane orientation preferred. The plane orientation can be determined by known techniques in the art, for example, by cross-section and measuring the angles between the substrate and epi film, for example by scanning electron microscope (SEM) or transmission electron microscope (TEM).

The growth (SEG) step is performed using a silicon-comprising precursor gas, for example, $SiH_2Cl_2$ (dichlorosilane), $SiH_4$ (silane) with added chlorine, $Si_2H_6$ (disilane) with added chlorine ($Cl_2$), HCl or $H_2$, and $SiCl_4$ (silicon tetrachloride). During processing, the gases become thermally dissociated and adsorb onto the silicon substrate whereupon hydrogen atoms are released and silicon is deposited epitaxially. During the SEG step, an epitaxial layer is grown selectively on the monocrystalline silicon substrate, with no growth taking place on insulative layers (e.g., $SiO_2$ and $Si_3N_4$ layers), such as the STI regions 16 and the insulative layer 20 overlying portions of the epitaxial layer.

The epitaxial layer 34a can be grown using a conventional selective silicon epitaxial (epi) growth apparatus (not shown), which is a batch- or single-wafer, chemical vapor deposition (CVD) system. In general, an epi apparatus includes a growth chamber, a wafer heating source, an inlet for the precursor gases, a support for the silicon substrate (e.g., susceptor), and an exhaust system to remove effluent gases. Single-wafer epitaxial reactors are manufactured, for example, by Applied Material, Inc.

In general, the semiconductive wafer is introduced into a growth chamber and transferred onto a heated susceptor. The wafer is heated to about 450° C. to about 950° C., preferably about 650° C. to about 750° C. The silicon-comprising precursor gas(es) are introduced into the growth chamber and flowed over the substrate at a low flow rate of about 10 to about 500 ccm, preferably less than about 100 sccm, for about 15 to about 30 seconds, while maintaining the chamber at a pressure of about 1 to about 20 Torr to provide a growth rate of about 20 to about 40 nm/minute, or at a pressure of about 0.02 to less than about 1 Torr to control facet growth at a lower rate of less than 20 nm/minute, preferably less than about 10 nm/minute to about 0.3 nm/minute. This provides control of layer thickness and formation of crystalline facets (100), (110) or (111) on the top surface of the epitaxial layers.

Figure 1C:
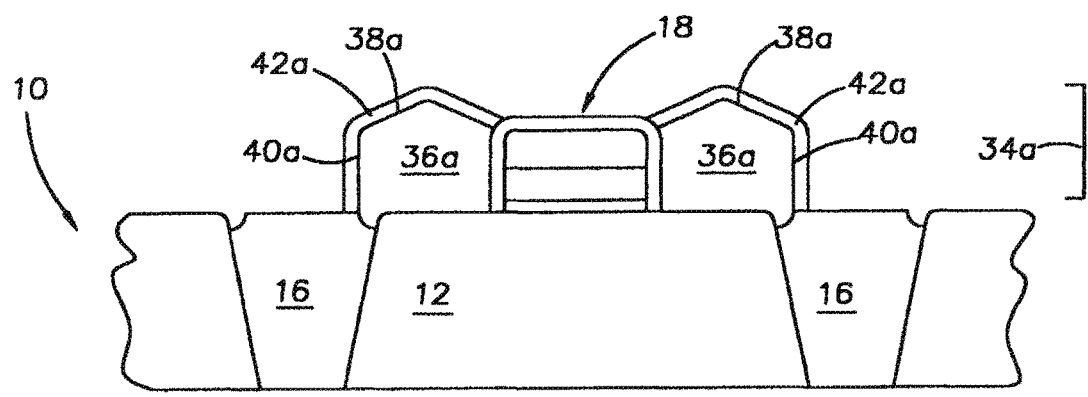

Once the facet is formed on the top surface 38a of the crystal 36a, a thin insulative layer 42a is formed over the epitaxial layer 34a. As illustrated in FIG. 1C, the insulative layer 42a is grown over the upper surface 38a and sidewalls

40a of the crystal 36a, preferably by rapid thermal anneal processing. The insulative layer 42a can comprise oxide, nitride, oxidized nitride, or a composite oxide/nitride layer. For example using rapid thermal oxidation (RTO), a thin silicon dioxide (SiO2) layer 42a can be formed by exposing the silicon surface to a dry oxygen (O2) gas at a pressure of approximately 100 to about 200 Torr and temperature of about 800° C. to about 1200° C. for about 15 to about 60 seconds, to deposit a thin (about 5 nm to about 20 nm) oxide film. By another example, a thin silicon nitride (Si3N4) layer 42a can be formed using rapid thermal nitridation (RTN) by exposing the surface of the epitaxial layer 34a to ammonia (NH3) or nitrogen (N2) gas at a pressure of approximately 100 to about 200 Torr and temperature of about 800° C. to about 1200° C. for about 15 to about 60 seconds to deposit a thin (about 2 nm to about 5 nm) nitride film over the exposed upper surface 38a and sidewalls 40a of the crystal 36a.

Figure 1D:
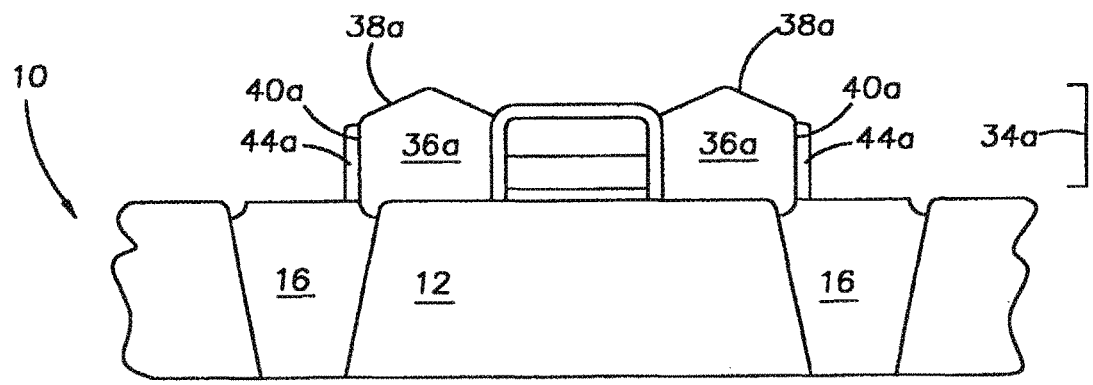

A portion of the thin insulative layer 42 is then removed to expose only the top surface 38a of the epitaxial layer 34a, as shown in FIG. 1D. The insulative material remaining on the vertical sidewall 40a of the crystal 36a forms a spacer 44a. An exemplary process for removing the insulative layer is by etching according to known procedures. Exemplary etch gases for etching the insulative layer 42a include fluorine-containing gases such as CF4, CHF3, CH2F2, C2F6, C3F8, C4F8, CH3F, CHF3/O2, CF4/O2, among others. The insulative spacer 44a inhibits subsequent epitaxial growth of silicon in a lateral direction extending from the sidewalls 40a of the crystal 36a. This limits growth of the silicon crystals to along the top surface 38a of the crystal 36a for continued epitaxial growth in a vertical direction from the substrate 12.

Figure 1E:
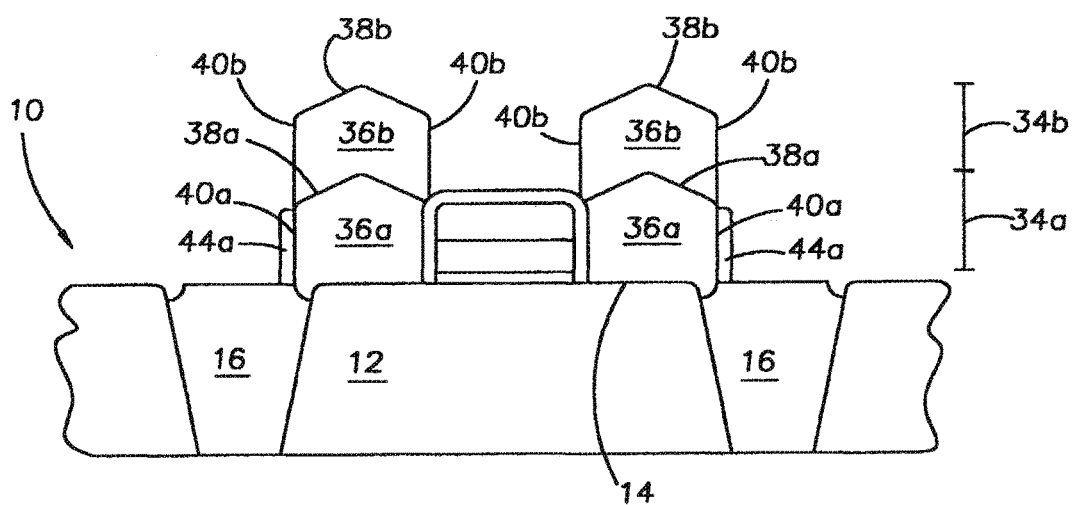

After the horizontal surface of the insulative layer 42a has been removed, further epitaxial growth on the exposed top surface 38a of the crystal 36a is commenced. Referring to FIG. 1E, a second epitaxial layer 34b of silicon is selectively grown on the exposed top surface 38a of the crystal 36a, by exposure to a silicon-comprising gas in an epi growth chamber, as previously described. The spacer 44a previously formed along the sidewall 40a of the crystal 36a serves to prevent epitaxial growth of silicon crystals in a lateral or horizontal direction from the sidewall 40a. The second epitaxial layer 34b comprises a single silicon crystal 36b that is selectively epitaxially grown preferably to provide a facet on its top surface 38b.

Figure 1F:
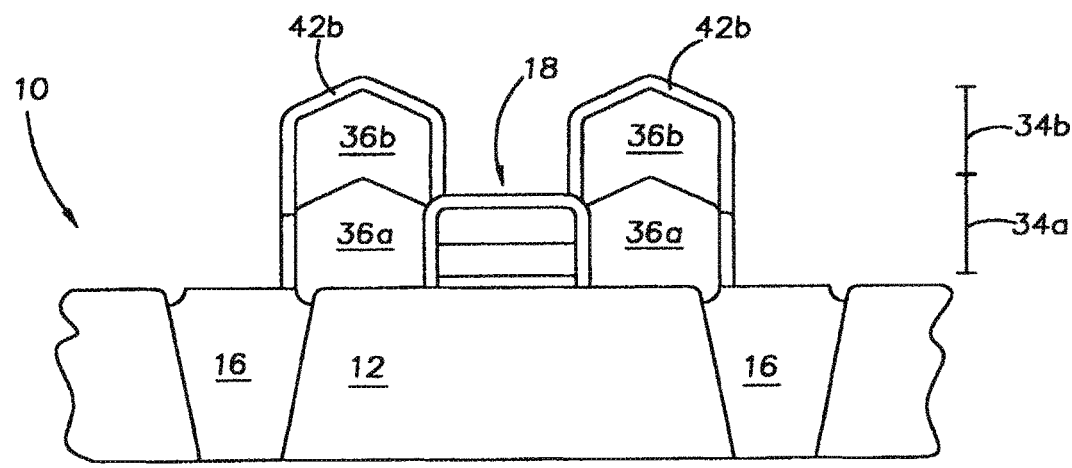

As depicted in FIG. 1F, a thin insulative layer 42b is then formed over the second epitaxial layer 34b, for example, by rapid thermal annealing, as previously described.

Figure 1G:
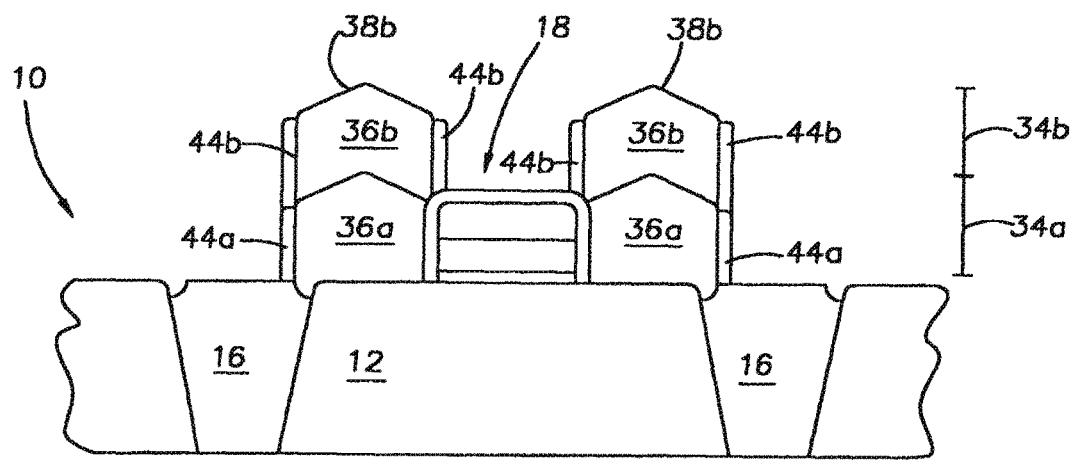
Figure 1H:
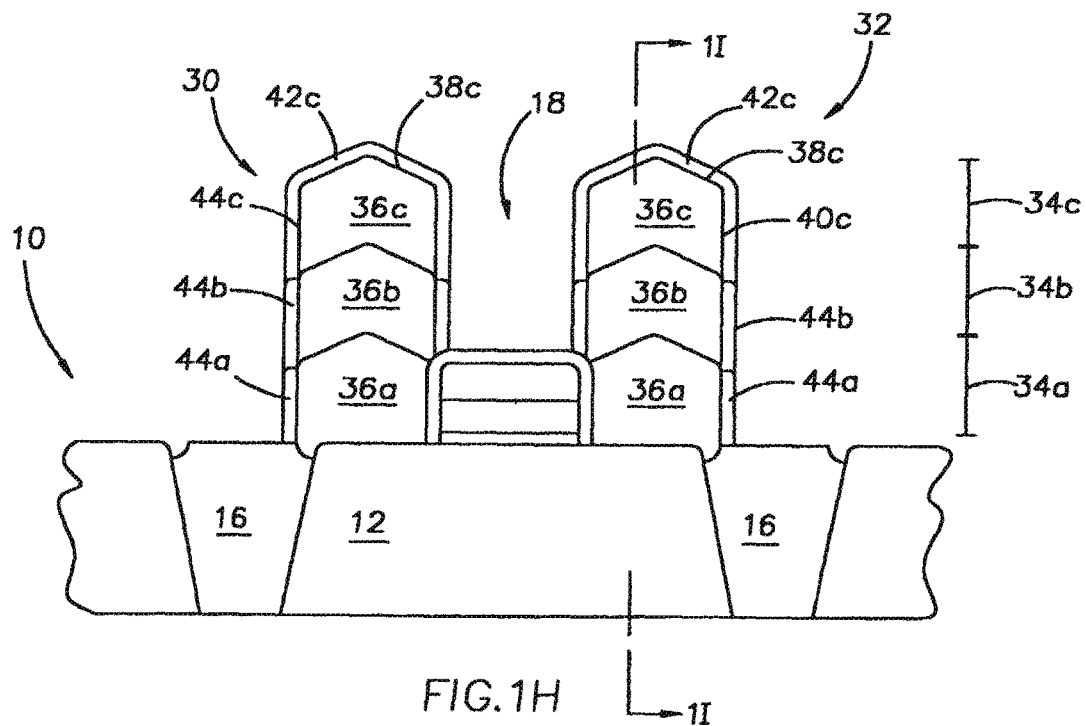
Figure 1I:
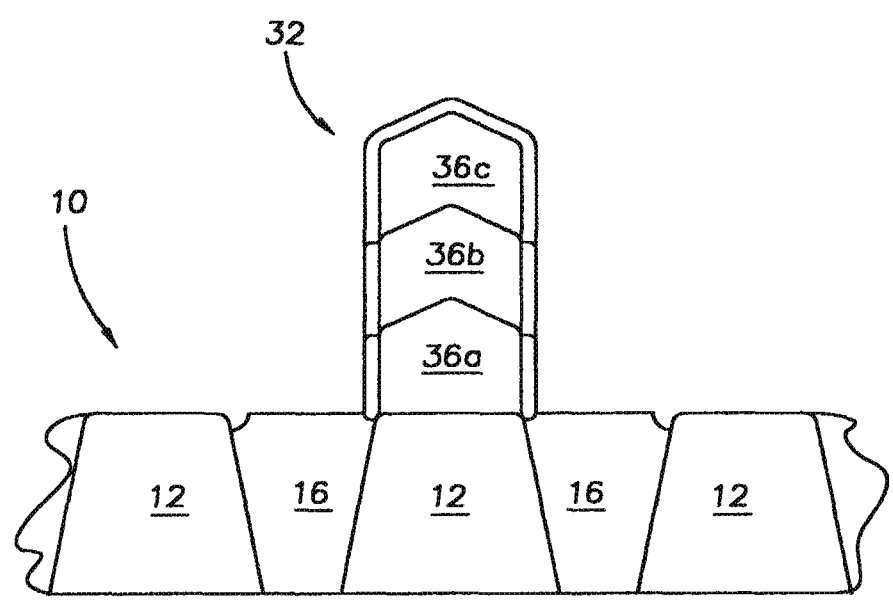
FIG. 1I is a cross-sectional view of the semiconductive wafer fragment of FIG. 1H taken along lines 1I-1I.

In a subsequent step, a portion of the thin insulative film 42b can then be etched to expose the top surface 38b of the crystal 36b, as shown in FIG. 1G.

A third epitaxial layer 34c can be grown on the exposed top surface 38b of the silicon crystal 36b comprising the second epitaxial layer 34b by a subsequent epitaxial growth step. The single crystal 36c is preferably grown until a facet is formed on the top surface 38c. The third epitaxial layer 34c can then be thermally annealed to form a thin insulative layer 42c over the crystal 36c, to result in the raised source/drain structures 30, 32, depicted in FIGS. 1H and H.

The epitaxial layers 34a, 34b forming the source and drain diffusion regions 30, 32 can be doped in situ to a p- or n-type conductivity by feeding a conductivity enhancing dopant to the reactor during one or more SEG process steps. Examples of dopants include p-dopants such as diborane (B2H6), boron tricholoride (BCl3) and boron trifluoride (BF3), and n-dopants such as phosphine (PH3) or arsine (AsH3). The conductivity enhancing dopant can be fed to the reactor during deposition at a variable rate, for example, from a lower rate to a later higher rate over time, to provide a concentration gradient through the thickness of the epitaxial layer.

The formed source/drain structures 30, 32 can also be doped to a p- or n-type conductivity by a conventional doping technique known and used in the art, preferably by ion implantation, using a fluorine-based gas such as PF3, PF5, AsF5, and B11F3, in an ionization chamber.

Figure 2A:
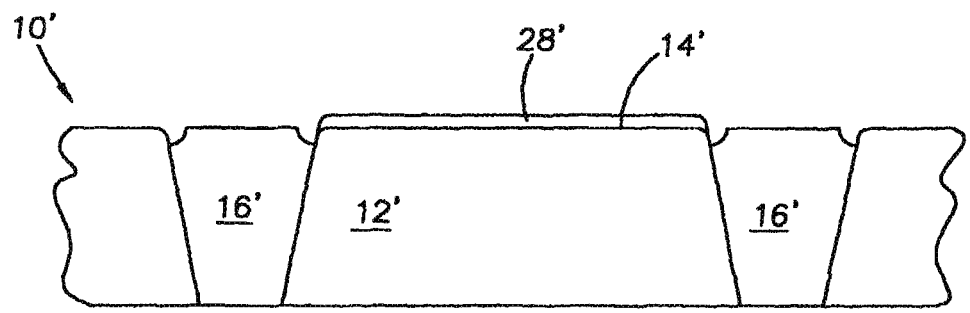
FIG. 2A is a diagrammatic cross-sectional view of a semiconductive wafer fragment at a preliminary step of a processing sequence.
Figure 2B:
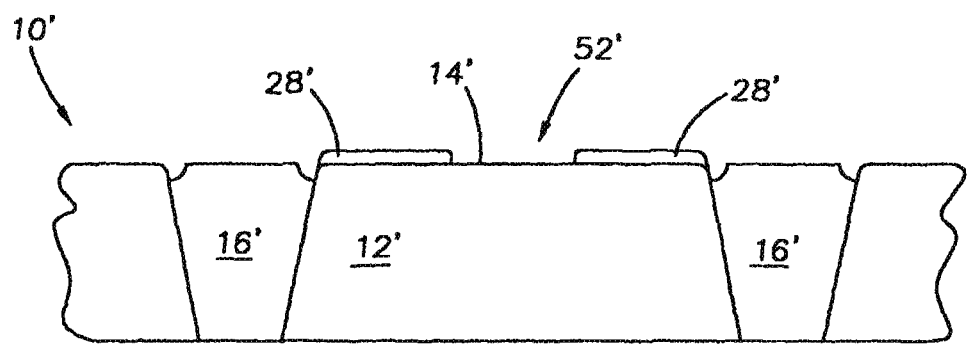
FIGS. 2B through 2F are views of the semiconductive wafer fragment of FIG. 2A at subsequent and sequential processing steps to fabricate a transistor including a raised source/drain formed according to an embodiment of the method of the invention.
Figure 2C:
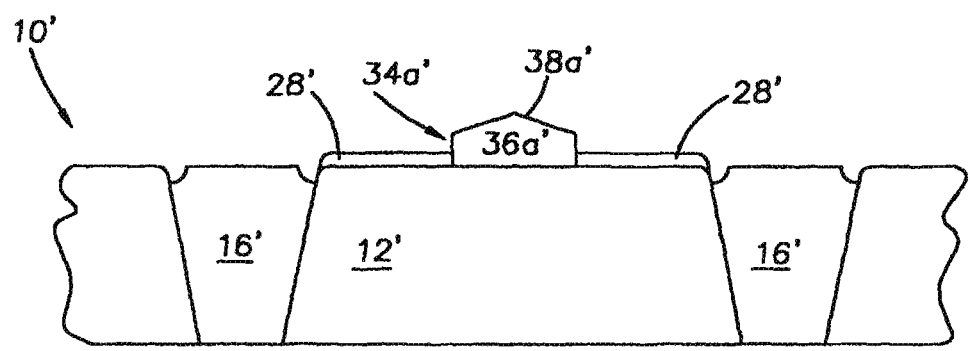
Figure 2D:
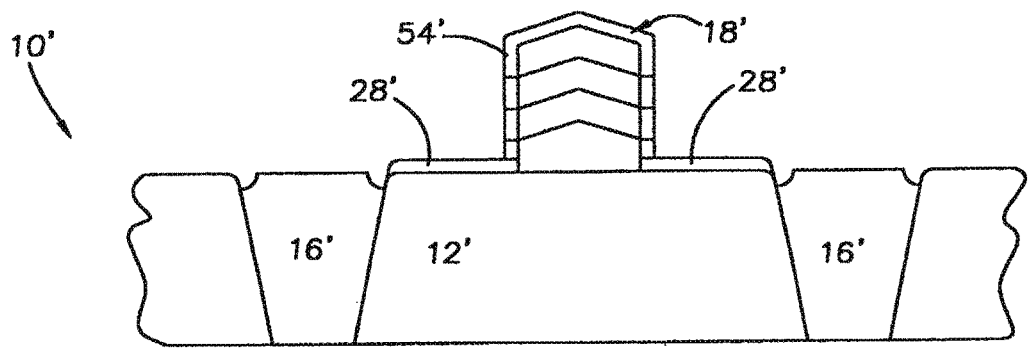
Figure 2E:
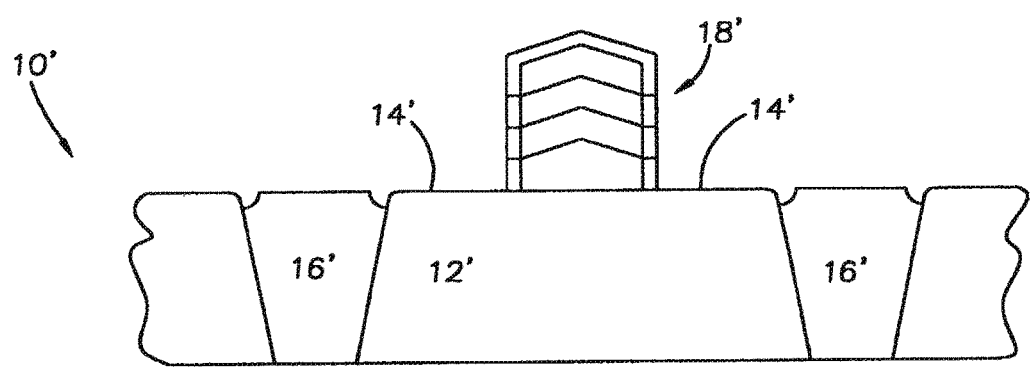
Figure 2F:
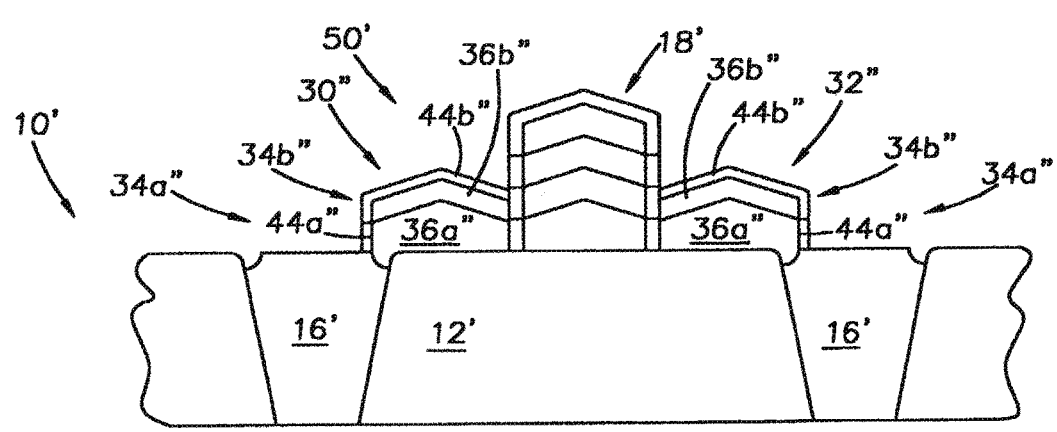

In another embodiment of the method of the invention, an elevated field effect transistor can be fabricated, as depicted in FIGS. 2A through 2F. As shown in FIG. 2F, the resultant transistor 50' is comprised of source/drain diffusion structures 30', 32' with a gate structure 18' therein between to impart an electric field to enable current to flow between the source 30' and the drain 32' regions.

Referring to FIG. 2A, a wafer fragment 10' is shown before processing and includes a monocrystalline silicon substrate 12' surrounded by STI regions 16'. The monocrystalline silicon substrate 12' is used as the substrate for the formation of the gate 18' and the source/drain 30', 32' (shown in FIG. 2F). Typically, the substrate 12' includes a light conductivity dopant concentration. Substrate 12' can be provided with a selected p- or n-doping, depending upon whether an NMOS or PMOS field effect transistor 50' is being formed in the substrate region. As shown, the surface 14' of the substrate 12' is covered by an oxide layer 28'.

Referring to FIG. 2B, an oxide dry etch step is first utilized to clear an opening portion 52' in the oxide layer 28' to expose the surface 14' of the silicon substrate 12' where the gate structure 18' is to be fabricated. Silicon epitaxial growth (SEG) is then performed as previously described with reference to FIGS. 1A through 1I, to form the gate structure 18'. In particular, as depicted in FIG. 2C, SEG is performed using the oxide layer 28' with opening 52' as a mask to form a first epitaxial layer 34a' on the exposed substrate surface 14'. The crystal 36a' of the first epitaxial layer has a facet on its upper surface 38a'. An insulative material is deposited over the epitaxial layer 34a', and then removed to expose the top surface of the epitaxial layer. The remaining insulative material provides spacers on the sidewalls of the epitaxial layer. One or more additional epitaxial layers can be grown as previously described with regard to FIGS. 1C through 1H, resulting in the gate structure 18' shown in FIG. 2D. The multi-layered gate structure 18' is encapsulated in an overlying insulating layer 54' comprised of the sidewall spacers and insulating layer formed onto the top surface of the uppermost epitaxial layer during the SEG processing steps.

Structures can then be formed adjacent to the gate structure 18' as depicted in FIGS. 2E and 2F, and provided with sufficiently high conductivity doping to effectively provide source and drain regions 30", 32" of the transistor 50'. As shown in FIG. 2E, the oxide layer 28' is removed, preferably by an oxide dry etch, to expose the surface 14' of the substrate 12'. The raised source 30" and raised drain 32" are then fabricated by growing an epitaxial layer 34a" of moncrystalline silicon on the surface 14' of the substrate 12', depositing an insulative layer and removing the layer to expose only the top surface of the epitaxial layer 34a" and leaving an insulative spacer 44a" on the sidewalls of the crystal 36a", and growing a second epitaxial layer 34b" comprising a single silicon crystal 36b" followed by an insulative layer 44b" over the epitaxial layer 34b".

Additional epitaxial layers can be grown as desired according to the foregoing steps to achieve the desired height of the structure. In a raised source/drain application, a minimum height of about 10 nm to about 30 nm is desired.

The source and drain diffusion structures 30", 32" can be doped in situ to a p- or n-type conductivity by feeding a conductivity enhancing dopant to the reactor during the SEG steps, or after formation by ion implantation, as described above.

Figure 3A:
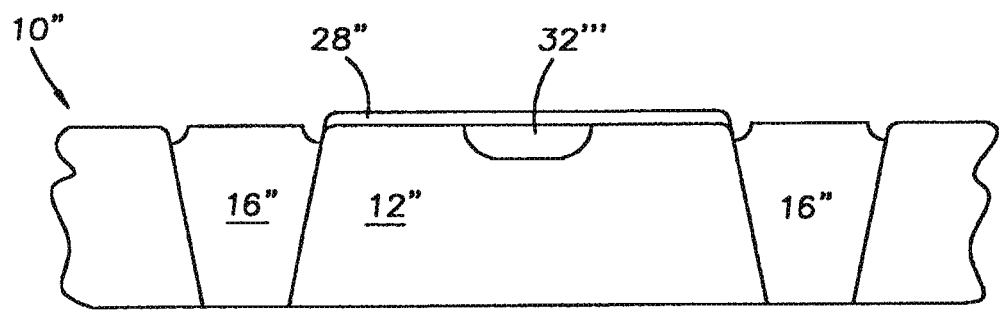
FIG. 3A is a diagrammatic cross-sectional view of a semiconductive wafer fragment at a preliminary step of a processing sequence.
Figure 3B:
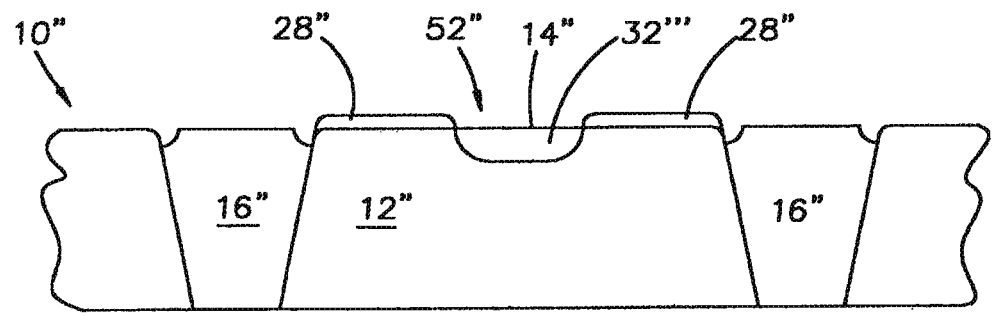
FIGS. 3B and 3C are views of the semiconductive wafer fragment of FIG. 3A at subsequent and sequential processing steps to fabricate a vertical transistor having a buried drain region and a stacked gate region with an overlying source region according to an embodiment of the method of the invention.
Figure 3C:
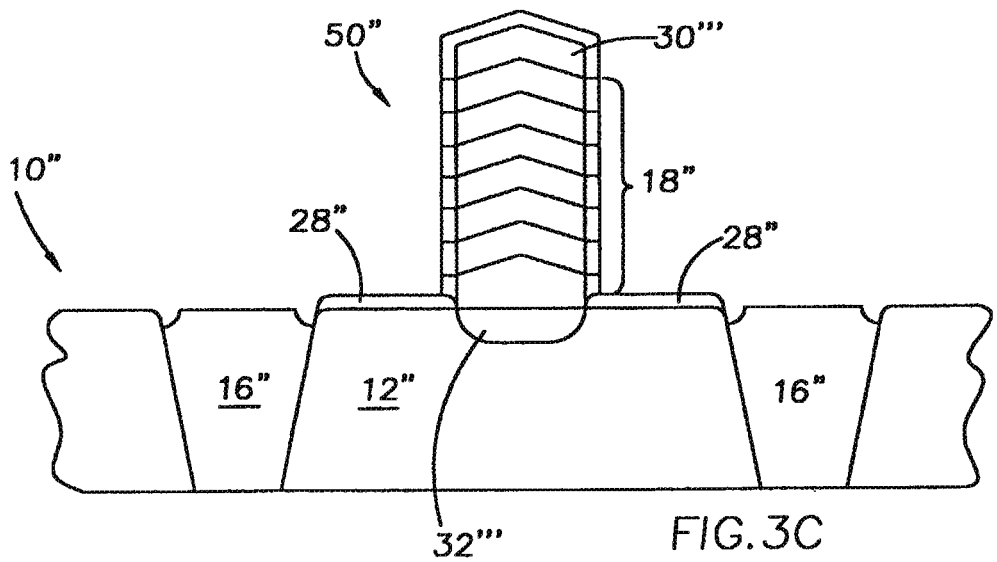

In another embodiment of the method of the invention a transistor 50" can be fabricated as depicted in FIGS. 3A through 3C. The transistor 50" includes a buried drain 32'", a vertical gate region 18" comprising multiple epitaxial layers over the buried drain 32", and a source region 30'" comprising one or more epitaxial layers above the gate region 18". Advantageously, the vertical nature of a transistor 50" comprising a buried drain region 32", a gate region 18" built over the drain, and a source region 30'" overlying the gate region, facilitates increased density memory structures in semiconductor fabrications.

Referring to FIG. 3A, the transistor 50" is fabricated by first forming a buried drain 32'" in the substrate 12" by heavily doping the drain region, about 50 nm to about 100 nm wide, by ion implantation. An oxide dry etch step can be utilized, as shown in FIG. 3B, to clear an opening 52" in the oxide layer 28" to expose the silicon substrate surface 14" overlying the buried drain 32'", which defines the location of the gate region 18". As shown in FIG. 3C, a first epitaxial layer is grown on the exposed substrate surface 14" by SEG using the oxide layer 28" as a mask. Additional epitaxial layers are then successively grown on the preceding epitaxial layer, as described with reference to FIGS. 1A through 1H, to form the gate region 18" having a desired height. Each of the epitaxial layers of the gate region comprise insulated sidewalls and a top surface. The source region 30'" is formed above the gate region 18" by growing one or more layers of epitaxial silicon above the uppermost epitaxial layer of the gate region 18". The source layer 30'" can be doped with an effective concentration of a conductivity enhancing dopant by feeding the dopant to the reactor during the SEG step, or by ion implantation with a dopant after the source layer 30'" is formed. The source layer 30" comprises insulated sidewalls and an insulated top surface.

In compliance with the statute, the invention has been described in language more or less specific as to structural and methodical features. It is to be understood, however, that the invention is not limited to the specific features shown and described, since the means herein disclosed comprise preferred forms of putting the invention into effect. Vertical structures other than those specifically described can be formed using the present method. The invention is, therefore, claimed in any of its forms or modifications within the proper scope of the appended claims appropriately interpreted in accordance with the doctrine of equivalents.

The invention claimed is:

1. A vertical transistor structure extending in a direction substantially normal to a semiconductive region of a substrate, comprising:
    a vertical transistor gate region oriented in a vertical plane from the substrate surface, including at least two overlying layers of epitaxially grown silicon, each epitaxial layer comprising a single silicon crystal having a top or upper surface defining a facet;
    a vertical transistor source including a diffusion region adjacent to said transistor gate region within the semiconductive region; and
    a vertical transistor drain including a diffusion region adjacent to said transistor gate region within the semiconductive region.

2. The vertical transistor structure as in claim 1, wherein said vertical transistor gate region has a plane orientation, and vertically-oriented and insulated sidewalls.

3. The vertical transistor structure as in claim 2, wherein said vertical transistor source is an elevated structure extending in a vertical plane from the substrate.

4. The vertical transistor structure as in claim 3, wherein said vertical transistor drain is an elevated structure extending in a vertical plane from the substrate.

5. The vertical transistor structure as in claim 1, wherein said vertical transistor source is a vertical structure comprising multiple epitaxial layers having insulated sidewalls and an insulated top surface on the uppermost epitaxial layer.

6. The vertical transistor structure as in claim 5, wherein said vertical transistor source is a vertical structure comprising multiple epitaxial layers having insulated sidewalls and an insulated top surface on the uppermost epitaxial layer.

7. The vertical transistor structure as in claim 2, wherein said vertical transistor drain is buried within the semiconductive substrate; and said vertical transistor source comprises at least one layer of epitaxially grown silicon overlying the uppermost layer of said gate region doped with a conductivity enhancing dopant having insulated sidewalls and on top surface.

8. The vertical transistor structure as in claim 7, wherein said vertical transistor drain comprises a doped area within the substrate underlying said vertical transistor gate region.

9. The vertical transistor structure as in claim 2, wherein said vertical transistor source is buried within the semiconductive substrate; and said vertical transistor drain comprises at least one layer of epitaxially grown silicon overlying the uppermost layer of said vertical transistor gate region doped with a conductivity enhancing dopant having insulated sidewalls and on top surface.

10. The vertical transistor structure as in claim 9, wherein said vertical transistor source comprises a doped area within the substrate underlying said vertical transistor gate region.

11. The vertical transistor structure as in claim 9, further comprising a series of oxide layers on the sides of each of said layers of single epitaxially grown silicon crystal silicon to form an insulating sidewall.

* * * * *